United States Patent
Chen et al.

(10) Patent No.: US 8,302,045 B2
(45) Date of Patent: Oct. 30, 2012

(54) ELECTRONIC DEVICE AND METHOD FOR INSPECTING ELECTRICAL RULES OF CIRCUIT BOARDS

(75) Inventors: Yung-Chieh Chen, Tu-Cheng (TW);
Hsien-Chuan Liang, Tu-Cheng (TW);
Shin-Ting Yen, Tu-Cheng (TW);
Shen-Chun Li, Tu-Cheng (TW);
Shou-Kuo Hsu, Tu-Cheng (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 60 days.

(21) Appl. No.: 12/965,938

(22) Filed: Dec. 13, 2010

(65) Prior Publication Data

US 2012/0066655 A1    Mar. 15, 2012

(30) Foreign Application Priority Data

Sep. 10, 2010   (TW) .................... 99130774

(51) Int. Cl.
*G06F 17/50* (2006.01)
(52) U.S. Cl. ......... 716/107; 716/100; 716/102; 716/139
(58) Field of Classification Search .................. 716/137, 716/100, 102, 107, 139
See application file for complete search history.

(56) References Cited

U.S. PATENT DOCUMENTS

| | | | | |
|---|---|---|---|---|
| 5,150,308 A * | 9/1992 | Hooper et al. | ................ | 716/104 |
| 5,267,175 A * | 11/1993 | Hooper | ......................... | 716/104 |
| 5,452,226 A * | 9/1995 | Hooper et al. | ................ | 716/104 |
| 6,587,997 B1 * | 7/2003 | Chen et al. | ..................... | 716/103 |
| 6,732,338 B2 * | 5/2004 | Crouse et al. | ................. | 716/112 |
| 6,775,806 B2 * | 8/2004 | Li | ................................ | 716/112 |
| 6,938,227 B2 * | 8/2005 | Murphy et al. | ................. | 716/102 |
| 7,136,797 B2 * | 11/2006 | Tosaka et al. | ................... | 703/14 |
| 7,430,729 B2 * | 9/2008 | McLain et al. | ................ | 716/100 |
| 7,975,247 B2 * | 7/2011 | Anantharaman et al. | ..... | 716/100 |
| 8,122,392 B2 * | 2/2012 | White et al. | ................... | 716/54 |
| 8,145,662 B2 * | 3/2012 | Chen et al. | ..................... | 707/767 |
| 2003/0182643 A1 * | 9/2003 | Crouse et al. | ................. | 716/5 |
| 2005/0193354 A1 * | 9/2005 | Ohba et al. | ........................ | 716/5 |
| 2006/0218516 A1 * | 9/2006 | McLain et al. | .................. | 716/10 |
| 2006/0259891 A1 * | 11/2006 | Ting | ............................... | 716/11 |
| 2008/0222203 A1 * | 9/2008 | Chu | ........................... | 707/104.1 |
| 2008/0244475 A1 * | 10/2008 | Lo et al. | ............................ | 716/4 |
| 2009/0031271 A1 * | 1/2009 | White et al. | .................... | 716/10 |
| 2009/0319961 A1 * | 12/2009 | Katz et al. | ......................... | 716/3 |
| 2010/0023898 A1 * | 1/2010 | Nomura et al. | ................... | 716/4 |
| 2010/0306720 A1 * | 12/2010 | Pikus et al. | ....................... | 716/5 |
| 2011/0061035 A1 * | 3/2011 | Oishi et al. | .................... | 716/106 |
| 2011/0107088 A1 * | 5/2011 | Eng et al. | ...................... | 713/155 |

* cited by examiner

*Primary Examiner* — Stacy Whitmore

(74) *Attorney, Agent, or Firm* — Altis Law Group, Inc.

(57) ABSTRACT

An electronic device and method for inspecting electrical rules of circuit boards includes selecting at least two design files that record electrical rules of the circuit boards and searching the electrical rules in the selected design files using preset parameter keywords. Same electrical rules of the selected design files are acquired by comparing the electrical rules in the selected design files. The same electrical rules and corresponding parameter values are input to a comparison table, and the comparison table is output.

13 Claims, 4 Drawing Sheets

| First design file: | | |
|---|---|---|
| C:\DCF Files\1-rules.dcf | | Run |
| Second design file: | | |
| C:\DCF Files\2-rules.dcf | | |
| Comparison table | | |
| Electrical rules | First parameter value in first design file | Second parameter value in second design file |
| PROPAGATION_DELAY_MIN | 2000MIL | 1000 MIL |
| PROPAGATION_DELAY_MAX | 4000 MIL | 5000 MIL |
|  |  |  |
|  |  |  |
| First sub table | | |
| Electrical rules | Parameter values in first design file |  |
| <NULL> | <NULL> |  |
| <NULL> | <NULL> |  |
| Second sub table | | |
| Electrical rules | Parameter values in second design file |  |
| DIFFP_PHASE_TOL | 5MIL |  |
| <NULL> | <NULL> |  |

FIG. 2

ELECTRONIC DEVICE AND METHOD FOR INSPECTING ELECTRICAL RULES OF CIRCUIT BOARDS

BACKGROUND

1. Technical Field

Embodiments of the present disclosure relate to inspecting technology, and more particularly to an electronic device and method for inspecting electrical rules of circuit boards by using the electronic device.

2. Description of Related Art

Design of an electronic device (e.g., a computer, or a server) usually includes a wiring diagram for a circuit board for the electronic device, where the wiring diagram is simulated and analyzed to determine properties of the wiring diagram. The properties of the wiring diagram include electrical rules (e.g., a max via count on the circuit board) and physical rules (e.g., a net physical type, and a net spacing type). A circuit diagram of the circuit board is designed according to the wiring diagram and properties.

During the design procedure, design engineers need to determine if electrical rules of a current designed circuit board are different from electrical rules of other circuit boards. It is difficult and inefficient to compare the electrical rules of different circuit boards manually. Thus, an electrical device and method for inspecting the electrical rules are desired.

BRIEF DESCRIPTION OF THE DRAWINGS

FIG. 2 is a schematic diagram of one embodiment of a simplified user interface of the inspection system of FIG. 1.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

In general, the word "module," as used herein, refers to logic embodied in hardware or firmware, or to a collection of software instructions, written in a programming language, such as, Java, C, or Assembly, for example. One or more software instructions in the modules may be embedded in firmware, such as an erasable programmable read only memory (EPROM). It will be appreciated that modules may comprise connected logic units, such as gates and flip-flops, and may comprise programmable units, such as programmable gate arrays or processors. The modules described herein may be implemented as either software and/or hardware modules and may be stored in any type of computer-readable medium or other computer storage system.

Figure 1:
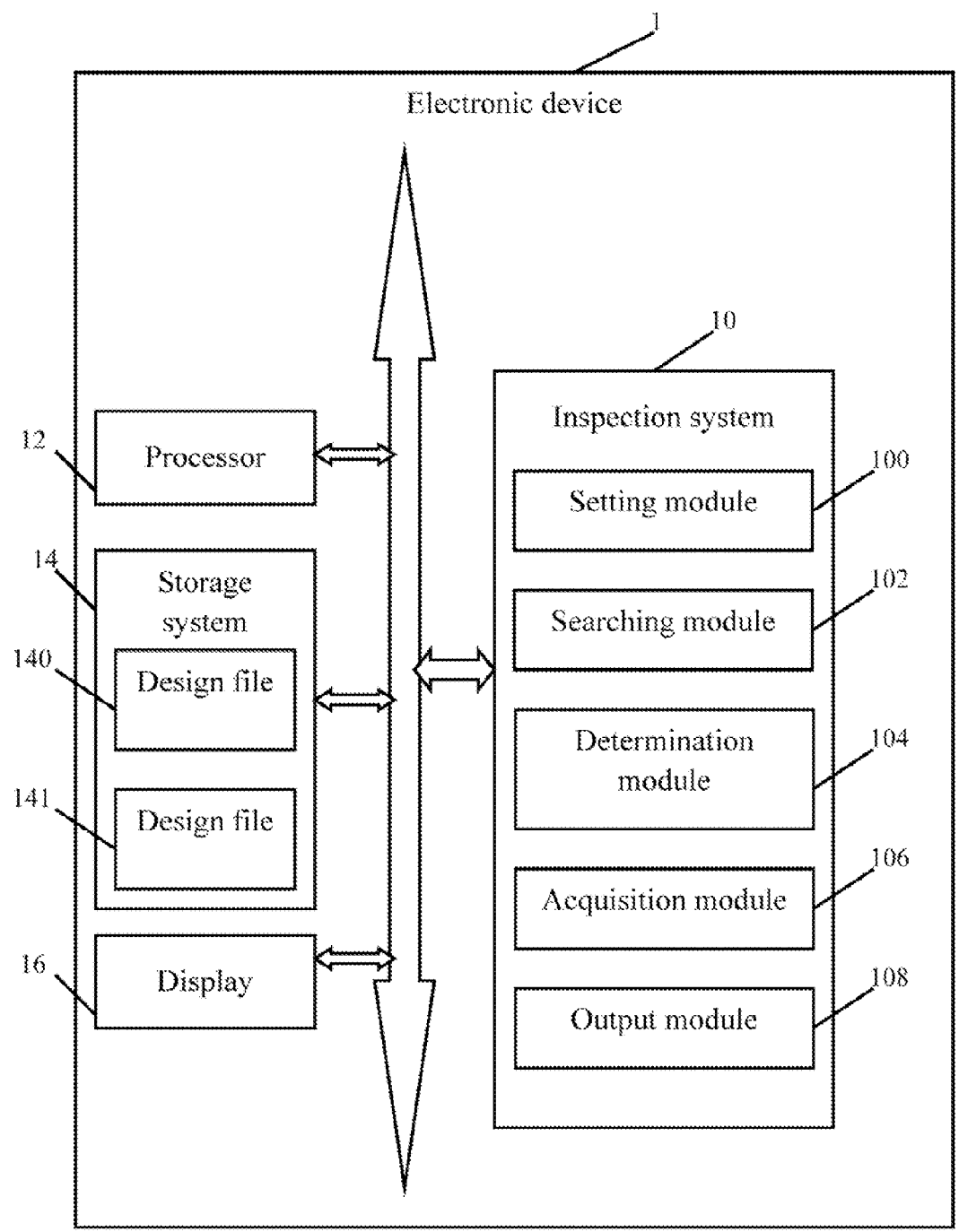
FIG. 1 is a block diagram of one embodiment of an electronic device including an inspection system.

FIG. 1 is a block diagram of one embodiment of an electronic device 1 including an inspection system 10. In some embodiments, the electronic device 1 may be used to compare electrical rules of different circuit boards using the inspection system 10, determine differences of the electrical rules, and highlight the differences to be viewed by users. Detailed descriptions of the inspection system 10 are provided below.

The electronic device 1 may be a computer, a server, or any other kind of electronic device. The electronic device 1 includes at least one processor 12, a storage system 14, and a display 16. The display 16 may display visible data, such as inspection results of the electrical rules. The processor 10 executes one or more computerized operations of the electronic device 1 and other applications, to provide functions of the electronic device 1. The storage system 14 stores one or more programs, such as programs of the operating system, other applications of the electronic device 1, and various kinds of data. In some embodiments, the storage system 14 may include a memory of the electronic device 1 and/or an external storage card, such as a memory stick, a smart media card, a compact flash card, or any other type of memory card.

The storage system 14 stores a plurality of design files that record design rules of different circuit boards. For simplification, there are merely two design files 140, 141 shown in FIG. 1. In some embodiments, the design rules of the circuit boards may include, but are not limited to physical rules and electrical rules. The physical rules refer to the physical size of the circuit board, components of the circuit board, for example, based on certain design rules, such as a line width, a spacing between lines, a flat walk length of the lines, for example. The electrical rules may be power or electrical properties of the design rules, such as wiring delay, a certain volume circuit board crosstalk, for example. An extension of the design files may be ".DCF", for example.

The inspection system 10 includes a setting module 100, a searching module 102, a determination module 104, an acquisition module 106, and an output module 108. The modules 100, 102, 104, 106 and 108 may include computerized codes in the form of one or more programs that are stored in the storage system 14. The computerized codes include instructions that are executed by the at least one processor 12 to provide functions for modules 100, 102, 104, 106 and 108. Details of these functions will be provided below.

The setting module 100 sets parameter keywords to search the electrical rules in the design files. In some embodiments, the parameter keywords may be parameter names of the electrical rules, such as "MAX_VIA_COUNT," "PROPAGATION_DELAY_MIN," "PROPAGATION_DELAY_MAX," for example. The parameter keywords may be modified, newly added, canceled by users according to inspection requirements.

The users may view the design files through the display 16, and select the design files by a mouse or a keyboard (not shown in FIG. 1) of the electronic device 1. In response to receiving user selections on the electronic device 1, the searching module 102 selects at least two design files from the storage system 14. The searching module 102 searches the electrical rules in the selected design files using the parameter keywords. In some embodiments, the selected design files may record different versions of design rules of a certain kind of circuit board. In other embodiments, the selected design files may include a standard design file and other design files to be compared with the standard design file. By comparing electrical rules in different design files, same electrical rules and/or different electrical rules may be found and be presented to the users.

In other embodiments, the setting module 100 further sets a position keyword to search a position of the electrical rules in the design files. The searching module 102 searches the selected design files to determine the position of the electrical rules in each of the selected design files according to the position keyword. The searching module 102 further searches the electrical rules using the parameter keywords from the determined position to the end of each of the design files.

Because each of the design files may record mass information, the position of the electrical rules may be easily determined using the position keyword, such as "designConstraints," for example. The electrical rules may be efficiently found by searching from the determined position of the electrical rules in the design files.

The determination module 104 determines if the selected design files record any same electrical rules by comparing the electrical rules of the selected design files. In some embodiments, the same electrical rules have same parameter names. The different electrical rules represents that one of the selected design files has one or more different parameters that the other selected design file does not have.

For example, the selected design files are the design file 140 and the design file 141. The design file 140 records five electrical rules: "a," "b," "c," "d," and "e." The design file 141 records four electrical rules: "a," "b," "c," and "d." The determination module 104 determines that the same electrical rules of the design file 140 and the design file 141 are "a," "b," "c," and "d," and the design file 140 further records a different electrical rule "e."

If the determination module 104 determines that the selected design files record same electrical rules, the acquisition module 106 acquires the same electrical rules of the selected design files, and acquires parameter values of the same electrical rules in each of the selected design files. If the determination module 104 also determines that the selected design files record different electrical rules, the acquisition module 104 acquires different electrical rules in the selected design files, and acquires parameter values of the different electrical rules in each of the selected design files.

In addition, the acquisition module 106 further determines specific electrical rules from the same electrical rules, the specific electrical rules have same parameter names and different parameter values in the selected design files.

The acquisition module 106 inputs the same electrical rules and corresponding parameter values in a comparison table, inputs the specific electrical rules and corresponding parameter values in the comparison table, and inputs the different electrical rules and corresponding parameter values in a sub table of the comparison table.

FIG. 2 is a schematic diagram of one embodiment of a simplified user interface of the inspection system 10. As shown in FIG. 2, two selected design files (e.g., a first design file and a second design file) are acquired by inputting storage paths of the two selected design files. The inspection system 10 is activated by clicking or pressing an icon "Run." The acquisition module 106 inputs two specific electrical rules of "PROPAGATION_DELAY_MIN" and "PROPAGATION_DELAY_MAX" in the comparison table, and inputs parameter values of the two specific electrical rules in the comparison table. For example, the electrical rules of "PROPAGATION_DELAY_MIN" corresponds to a first parameter value of "2000 mil" in the first design file, and corresponds to a second parameter value of "1000 mil" in the second design file.

The acquisition module 106 further inputs a different electrical rule of the second design file and a corresponding parameter value in a second sub table of the comparison table. For example, the different electrical rule is "DIEFP_PHASE_TOL," and corresponds to a parameter value of "5 mil." The second sub table corresponds to the second design file, and is used to record the different electrical rule of the second sub table. If the second design file has all of the electrical rules of the first design file, the first design file is determined to have no different electrical rules. Thus, a first sub table in the comparison table is null.

According to the simplified user interface shown in FIG. 2, the users may easily view the specific electrical rules and different electrical rules of the selected design files. It should be noted that, FIG. 2 only shows the simplified user interface, actually, the user interface of the inspection system 10 may include more icons, columns, and functions.

The output module 108 outputs the comparison table including the sub table to the display 16 of the electronic device 1, or a printer (not shown in FIG. 1). The output module 108 may further highlight the different parameter values of the specific electrical rules in the comparison table. For example, the output module 108 can highlight the parameter values with bright colors, bold fonts, or italic fonts.

Figure 3A:
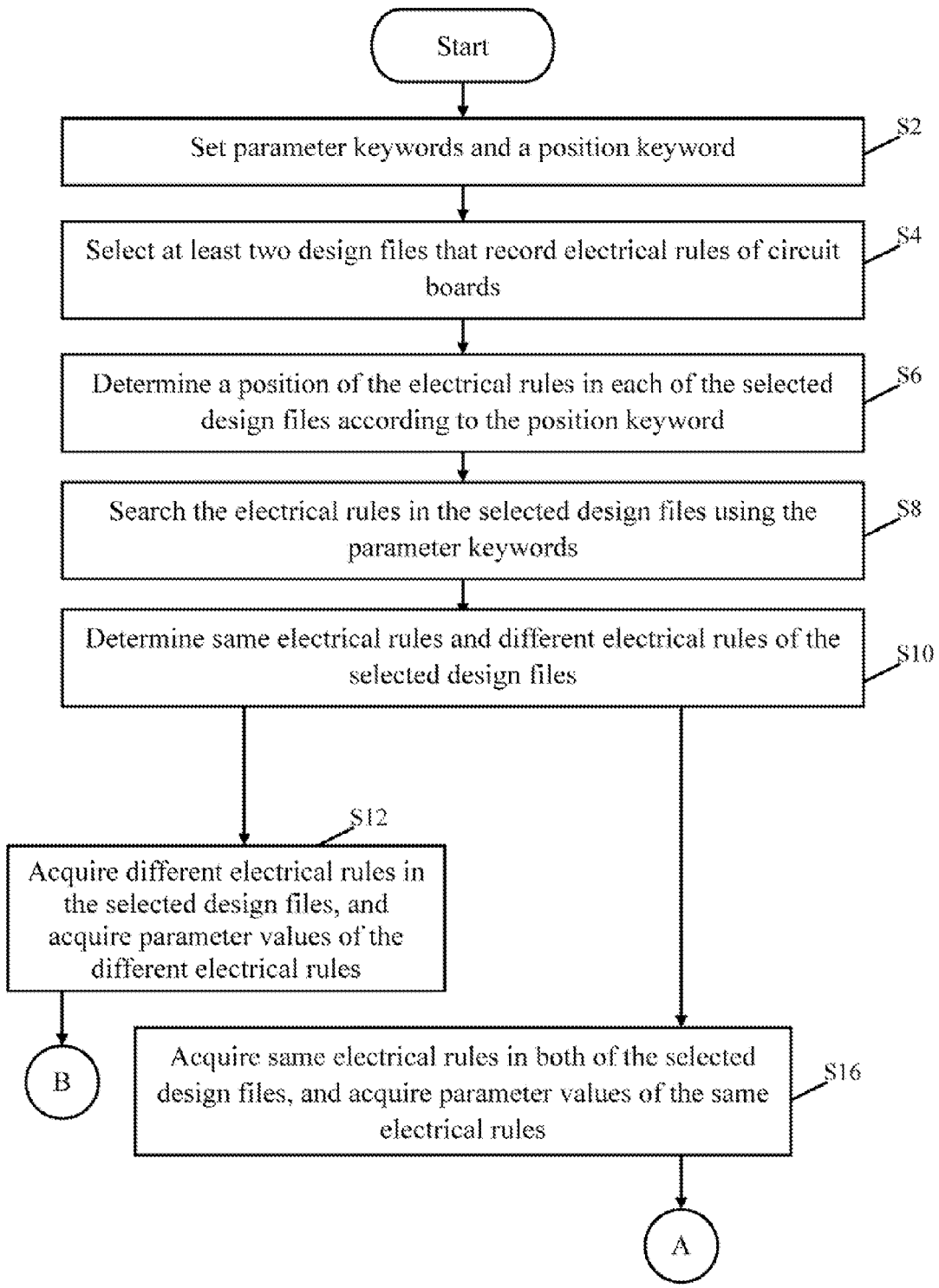
FIGS. 3A and 3B are flowcharts of one embodiment of a method for inspecting electrical rules of circuit boards using the electronic device of FIG. 1.
Figure 3B:
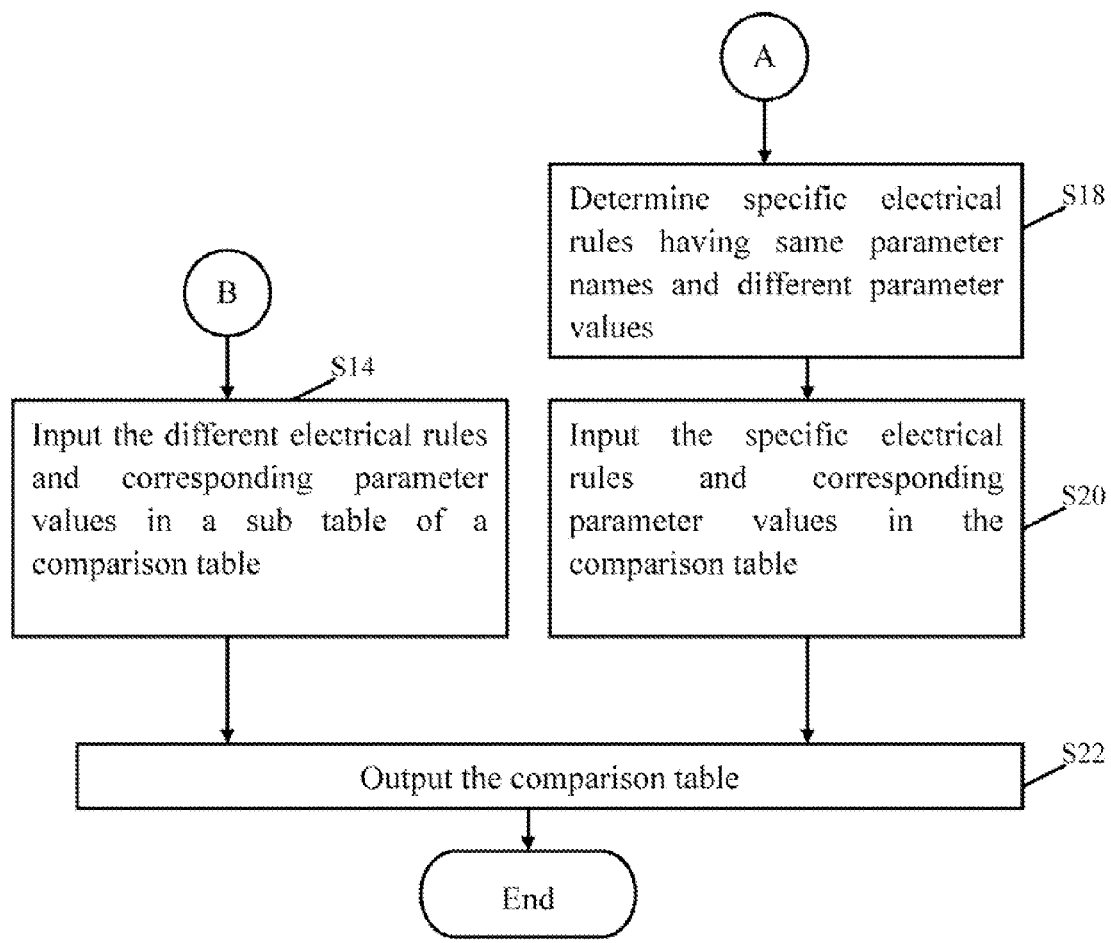

FIGS. 3A and 3B are flowcharts of one embodiment of a method for inspecting electrical rules of circuit boards using the electronic device 1 of FIG. 1. Depending on the embodiment, additional blocks may be added, others removed, and the ordering of the blocks may be replaced.

In block S2, the setting module 100 sets parameter keywords to search the electrical rules in the design files, and sets a position keyword to search a position of the electrical rules in the design files. As mentioned above, the parameter keywords may be parameter names of the electrical rules, such as "MAX_VIA_COUNT," for example.

In block S4, the searching module 102 selects at least two design files from the storage system 14 in response to receiving user selections on the electronic device 1. The selected design files record design rules of different circuit boards.

In block S6, the searching module 102 searches the selected design files to determine the position of the electrical rules in each of the selected design files according to the position keyword.

In block S8, the searching module 102 searches the electrical rules using the parameter keywords from the determined position to the end of each of the design files.

In block S10, the determination module 104 determines same electrical rules and different electrical rules of the selected design files by comparing the electrical rules of the selected design files. As mentioned above, the same electrical rules have the same parameter names, and the different electrical rules have different parameter names. The different electrical rules represents that one of the selected design files has one or more different parameters that the other selected design file does not have.

If the determination module 104 determines that the selected design files record different electrical rules, in block S12, the acquisition module 104 acquires different electrical rules in the selected design files, and acquires parameter values of the different electrical rules in each of the selected design files.

In block S14, the acquisition module 106 inputs the different electrical rules and corresponding parameter values in a sub table of a comparison table, and then the procedure goes to block S22.

If the determination module 104 determines that the selected design files record same electrical rules, in block S16, the acquisition module 106 acquires the same electrical rules of the selected design files, and acquires parameter values of the same electrical rules in each of the selected design files.

In block S18, the acquisition module 106 determines specific electrical rules from the same electrical rules, the specific electrical rules have same parameter names and different parameter values in the selected design files.

In block S20, the acquisition module 106 inputs the specific electrical rules and corresponding parameter values in the comparison table, and the output module 108 highlights the different parameter values of the specific electrical rules in the comparison table.

In block S22, the output module 108 outputs the comparison table including the sub table to the display 16 of the electronic device 1, or a printer.

Although certain embodiments of the present disclosure have been specifically described, the present disclosure is not to be construed as being limited thereto. Various changes or modifications may be made to the present disclosure without departing from the scope and spirit of the present disclosure.

What is claimed is:

1. A method for inspecting electrical rules of circuit boards using an electronic device, the electronic device comprising a processor and a storage system, the storage system storing a plurality of design files that record the electrical rules of the circuit boards, the method comprising:
   setting parameter keywords to search the electrical rules;
   selecting at least two design files from the storage system;
   searching, using the processor, the electrical rules in the selected design files according to the parameter keywords;
   acquiring same electrical rules of the selected design files;
   acquiring parameter values of the same electrical rules in each of the selected design files; and
   inputting the same electrical rules and corresponding parameter values in a comparison table, and outputting the comparison table;
   acquiring different electrical rules in the selected design files, and acquiring parameter values of the different electrical rules; and
   inputting the different electrical rules and corresponding parameter values in a sub-table of the comparison table.

2. The method according to claim 1, further comprising:
   setting a position keyword of the electrical rules; and
   searching the selected design files to determine a position of the electrical rules in each of the selected design files according to the position keyword.

3. The method according to claim 1, further comprising:
   acquiring specific electrical rules from the same electrical rules, the specific electrical rules having same parameter names and different parameter values in the selected design files; and
   highlighting the different parameter values of the specific electrical rules in the comparison table.

4. The method according to claim 1, wherein each of the design files is in a DCF (dictionary and constraints file) format.

5. An electronic device, comprising:
   a storage system to store a plurality of design files that record the electrical rules of a circuit board;
   at least one processor; and
   one or more programs stored in the storage system and being executable by the at least one processor, the one or more programs comprising:
   a setting module operable to set parameter keywords to search the electrical rules;
   a searching module operable to select at least two design files from the storage system, and search the electrical rules in the selected design files using the parameter keywords;
   an acquisition module operable to acquire same electrical rules in both of the selected design files, and acquire parameter values of the same electrical rules in each of the selected design files; and
   an output module operable to input the same electrical rules and corresponding parameter values in a comparison table, and output the comparison table;
   the acquisition module further operable to acquire different electrical rules in the selected design files, and acquire parameter values of the different electrical rules; and
   the output module further operable to input the different electrical rules and corresponding parameter values in a sub-table of the comparison table.

6. The electronic device according to claim 5, wherein the setting module is further operable to set a position keyword of the electrical rules to search a position of the electrical rules.

7. The electronic device according to claim 6, wherein the searching module is further operable to search the selected design files to determine the position of the electrical rules in each of the selected design files according to the position keyword.

8. The electronic device according to claim 5, wherein the acquisition module is further operable to acquire specific electrical rules from the same electrical rules, the specific electrical rules having same parameter names and different parameter values in the selected design files.

9. The electronic device according to claim 8, wherein the output module is further operable to highlight the different parameter values of the specific electrical rules in the comparison table.

10. A non-transitory storage medium storing a set of instructions, the set of instructions capable of being executed by a processor to perform a method for inspecting electrical rules of circuit boards using an electronic device, the electronic device comprising a storage system, the storage system storing a plurality of design files that record the electrical rules of the circuit boards, the method comprising
    setting parameter keywords to search the electrical rules;
    selecting at least two design files from the storage system;
    searching the electrical rules in the selected design files using the parameter keywords;
    acquiring same electrical rules of the selected design files;
    acquiring parameter values of the same electrical rules in each of the selected design files; and
    inputting the same electrical rules and corresponding parameter values in a comparison table, and outputting the comparison table;
    acquiring different electrical rules in the selected design files, and acquiring parameter values of the different electrical rules; and
    inputting the different electrical rules and corresponding parameter values in a sub-table of the comparison table.

11. The non-transitory storage medium as claimed in claim 10, wherein the method further comprises:
    setting a position keyword of the electrical rules; and
    searching the selected design files to determine a position of the electrical rules in each of the selected design files according to the position keyword.

12. The non-transitory storage medium as claimed in claim 10, wherein the method further comprises:
    acquiring specific electrical rules from the same electrical rules, the specific electrical rules having same parameter names and different parameter values in the selected design files; and
    highlighting the different parameter values of the specific electrical rules in the comparison table.

13. The non-transitory storage medium as claimed in claim 10, wherein each of the design files is in a DCF (dictionary and constraints file) format.

* * * * *